US008608285B2

(12) United States Patent
Abe (10) Patent No.: US 8,608,285 B2
(45) Date of Patent: Dec. 17, 2013

(54) LIQUID DISCHARGE HEAD AND MANUFACTURING METHOD THEREFOR

(75) Inventor: Hiroshi Abe, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 172 days.

(21) Appl. No.: 13/097,503

(22) Filed: Apr. 29, 2011

(65) Prior Publication Data

US 2011/0292125 A1      Dec. 1, 2011

(30) Foreign Application Priority Data

May 31, 2010    (JP) .................. 2010-125115

(51) Int. Cl.
*B41J 2/14*    (2006.01)
*B41J 2/16*    (2006.01)

(52) U.S. Cl.
USPC .......................................... 347/50

(58) Field of Classification Search
USPC ............................. 347/44, 58, 50
See application file for complete search history.

(56) References Cited

U.S. PATENT DOCUMENTS

| 7,192,123 | B2 * | 3/2007 | Touge ............... | 347/58 |
| 2006/0232633 | A1 * | 10/2006 | Kubo et al. ........ | 347/58 |
| 2011/0211024 | A1 * | 9/2011 | Kawamura et al. ... | 347/58 |

FOREIGN PATENT DOCUMENTS

| JP | 07-335680 A | 12/1995 |
| JP | 08-336963 A | 12/1996 |
| JP | 2007-296638 A | 11/2007 |

* cited by examiner

*Primary Examiner* — Matthew Luu
*Assistant Examiner* — Renee I Wilson
(74) *Attorney, Agent, or Firm* — Fitzpatrick, Cella, Harper & Scinto (57) ABSTRACT

A liquid discharge head includes a recording element board provided with an energy generating element, an electrical wiring board to supply the energy generating element with an electrical signal, a supporting member to support the recording element board and the electrical wiring board, a plurality of wires to connect a plurality of terminals provided on the recording element board and a plurality of terminals provided on the electrical wiring board, and a sealing member. The plurality of wires include a plurality of transmitting wires contributory to transmission of the electrical signal and a plurality of non-transmitting wires non-contributory to the transmission and formed at a higher position than that of the transmitting wires from a surface of the supporting member which supports the recording element board. The sealing member is arranged to cover the plurality of transmitting wires as well only some parts of the plurality of non-transmitting wires.

7 Claims, 6 Drawing Sheets

LIQUID DISCHARGE HEAD AND MANUFACTURING METHOD THEREFOR

BACKGROUND OF THE INVENTION

1. Field of the Invention

The present invention relates to a liquid discharge head which performs a recording operation by discharging a liquid to a recording medium such as recording paper as well as to a manufacturing method for the liquid discharge head.

2. Description of the Related Art

Apparatus equipped with a liquid discharge head such as an inkjet recording head involve relatively low running costs and readily lend themselves to downsizing. Furthermore, such apparatus readily support color image recording using inks of multiple colors as liquids, and are thus widely used as computer-related output devices and introduced commercially.

Figure 1:
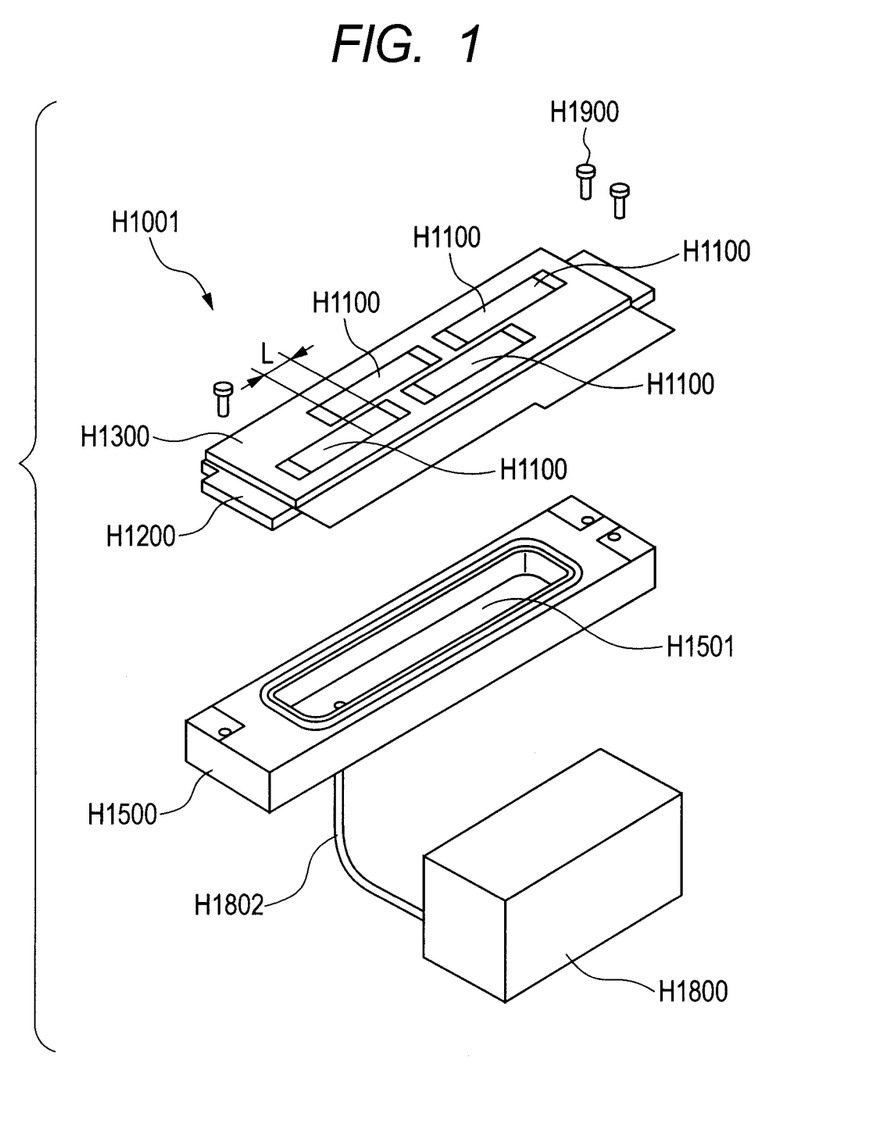
FIG. 1 is a schematic perspective view of a conventional liquid discharge head.

Among recent liquid discharge heads, a head of a wide type is known which performs recording on a line by line basis using a large number of discharge ports adapted to discharge liquids and arranged in a width direction of a recording medium over a width equal to a recording width. Such a wide liquid discharge head is disclosed in Japanese Patent Application Laid-Open No. 2007-296638, and an exploded perspective view thereof is illustrated in FIG. 1 of the present application. The liquid discharge head includes a supporting substrate H1200, a number of recording element boards H1100 on which a large number of discharge ports (not shown) adapted to discharge liquids are formed, and an electrical wiring board H1300 adapted to supply electrical signals to the recording element boards H1100, where the recording element boards H1100 and electrical wiring board H1300 are arranged on the supporting substrate H1200. Specifically, the recording element boards H1100 are arranged in a staggered manner and have overlapping regions L along a recording direction (moving direction of a carriage which supports the head). The liquid discharge head is configured such that there will be no clearance in the recording direction between an end of a discharge port group on each recording element board H1100 and ends of discharge port groups on adjacent recording element boards H1100.

Detailed configuration of the liquid discharge head will be described below with reference to FIGS. 1, 2A, 2B, 2C and 3.

Figure 2A:
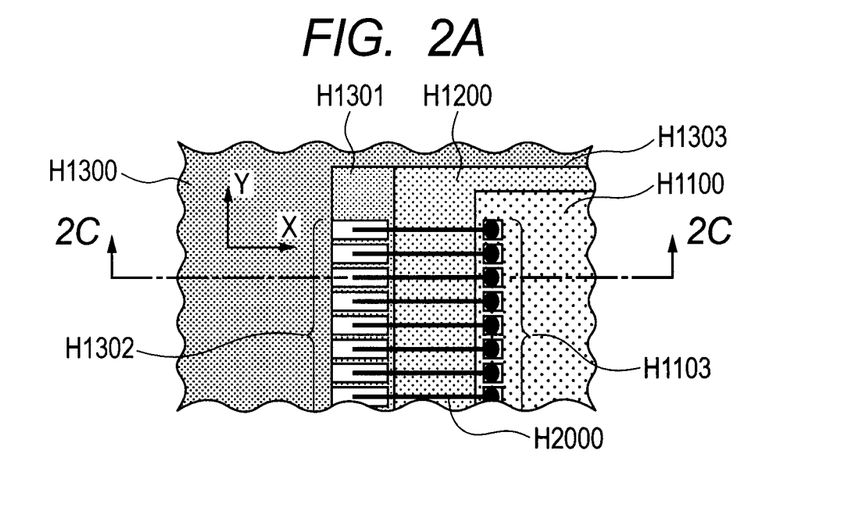
FIG. 2A is a schematic plan view illustrating the neighborhood of a mounting structure of a recording element board in the conventional liquid discharge head before sealing.
Figure 2B:
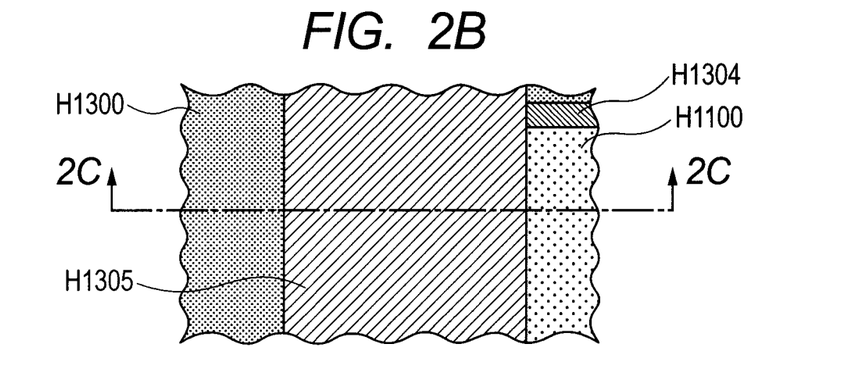
FIG. 2B is a schematic plan view illustrating the neighborhood of the mounting structure of the recording element board in the conventional liquid discharge head after sealing.
Figure 2C:
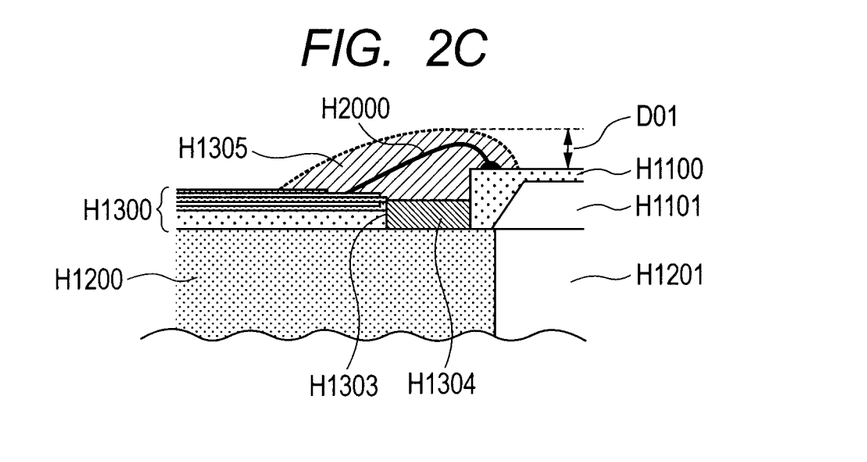
FIG. 2C is a schematic sectional view taken along line 2C-2C in FIG. 2A or 2B, illustrating the neighborhood of the mounting structure of the recording element board in the conventional liquid discharge head after sealing.

FIGS. 2A to 2C are schematic diagrams showing an electrical wiring board H1300 and recording element board H1100 of a conventional liquid discharge head and their surroundings. FIG. 2A illustrates a state before wires H2000 adapted to electrically interconnect the electrical wiring board H1300 and recording element board H1100 are sealed with a sealing member. FIG. 2B is a schematic plan view showing a state after the transmitting wires H2000 are sealed. FIG. 2C is a schematic sectional view taken along line 2C-2C in FIGS. 2A and 2B. The electrical wiring board H1300 supplies the recording element board H1100 with electrical signals such as a recording signal from a main body of a recording apparatus (not shown). The electrical wiring board H1300 has predetermined wires and an opening H1303. A terminal group H1302 corresponding to a terminal group H1103 of the recording element board H1100 is formed on both sides of the opening H1303. Incidentally, in FIG. 2A, in which no sealing member is applied, the supporting substrate H1200 which supports the recording element board H1100 and electrical wiring board H1300 is visible through the opening H1303. A flow path H1101 adapted to guide a liquid to the discharge ports is formed in the recording element board H1100. The recording element board H1100 is placed by aligning the flow path H1101 with a liquid supply port H1201 formed in the supporting substrate H1200 and is firmly bonded to the supporting substrate H1200 by a first adhesive. Then, the electrical wiring board H1300 is firmly bonded to the supporting substrate H1200 by a second adhesive so as to position the recording element board H1100 in the opening H1303 of the electrical wiring board H1300. The recording element board H1100 and electrical wiring board H1300 are electrically interconnected using the wires H2000 made of gold.

There is a clearance between the recording element board H1100 placed in the opening H1303 of the electrical wiring board and side walls of the opening H1303 of the electrical wiring board. The clearance, i.e., space around an outer periphery of the recording element board H1100 is filled with a first sealing member H1304. This enables sealing and protecting the periphery of the opening H1303 of the electrical wiring board H1300 and side faces of the recording element board H1100 and thereby prevents corrosion resulting from contact with minute liquid droplets scattered when a liquid such as ink is discharged.

Besides, at opposite ends in longitudinal direction (X direction in FIG. 2A) of the long-sized electrical wiring board H1300, a second sealing member H1305 is applied at the position of the wires H2000 electrically interconnecting the electrical wiring board H1300 and recording element board H1100. Consequently, electrical connections including the peripheries of the terminal groups H1103 and H1302 of the recording element board H1100 and electrical wiring board H1300 and the wires H2000 are protected from corrosion resulting from contact with a liquid such as ink droplets.

In the liquid discharge head illustrated in FIGS. 2A to 2C, when the sealing members H1304 and H1305 are applied, application amounts are adjusted through adjustment of pressure applied to the sealing members H1304 and H1305. However, viscosity of the sealing members H1304 and H1305 vary with the temperature and time, which may cause variations in the application amounts of the sealing members H1304 and H1305.

Figure 3:
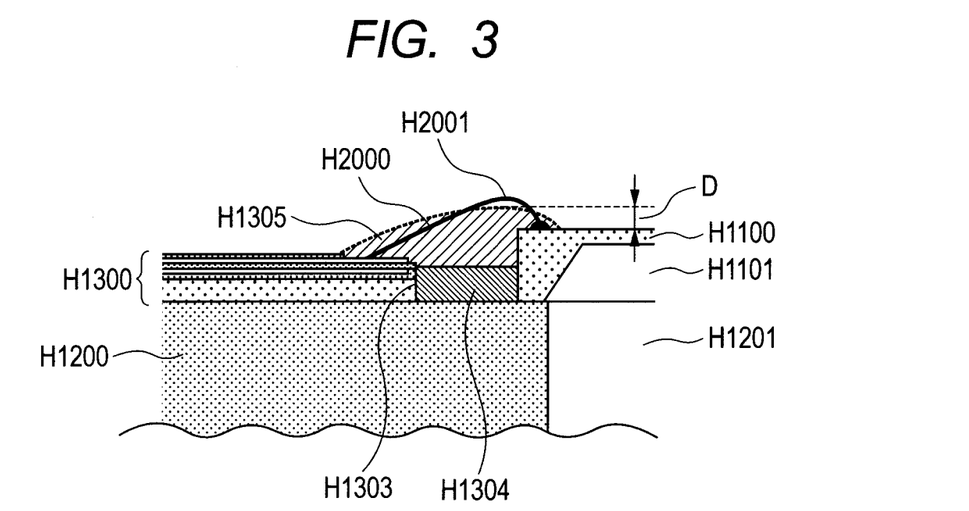
FIG. 3 is a schematic sectional view corresponding to FIG. 2C, illustrating a state when a sealing member is small in amount.

When there are variations in the application amounts, it becomes difficult to apply desired amounts of the sealing members H1304 and H1305. Consequently, as illustrated in FIG. 3, the second sealing member H1305 intended to seal the wires H2000 could fall short of a required application amount, exposing part of the wires (hereinafter also referred to as an exposed portion) H2001 from the sealing member H1305.

If part of the wires H2001 is exposed, the exposed portion H2001 comes into contact with water, air or ink, and could get chemically corroded by the water, air or ink. In particular, adhesion of liquid ink can pose a problem in that chemical corrosion will have a significant impact, degrading electrical characteristics of the wires.

Normally, the liquid discharge head is equipped with a cleaning mechanism adapted to wipe a face (hereinafter referred to as a discharge port side surface) on which the discharge ports are formed. When the cleaning mechanism comes into operation, the exposed portion H2001 of the wires not protected by the sealing member H1305 comes into direct contact with a wiping rubber blade, experiencing a mechanical load. In that case, the wires H2000 could get broken or deformed.

Thus, generally, the application amount of the sealing member H1305 is increased to prevent exposure of the wires H2000. However, increasing the application amount of the sealing member H1305 increases height D01 of the sealing member H1305 on the recording element board H1100 as well. For the liquid discharge head, the height D01 of the sealing member H1305 is a determining factor of an interval between the recording medium and discharge port side surface. That is, when the height D01 of the sealing member H1305 is increased, distance between the recording medium and discharge port side surface is increased accordingly. This reduces landing accuracy of the liquid, making it difficult to do high-quality printing.

Generally, with the liquid discharge head, to remove liquid droplets and dust adhering to the discharge port side surface, the discharge port side surface is cleaned using a rubber blade or the like. In so doing, if the height D01 of the sealing member H1305 is large, there can be a problem of decreased cleaning effects at and around the discharge port side surface.

From this point of view, it is desired to seal the wires H2000 which contribute to electrical connection with a sealing member so as not to expose the wires. The height of the sealing member can be kept as low as possible.

Japanese Patent Application Laid-Open No. H08-336963 clearly points out a problem in that a sealing member is drawn to a center of a sealing portion, exposing ends of wires. To solve this problem, Japanese Patent Application Laid-Open No. H08-336963 proposes to form dummy wires on the outside of principal wires in order to prevent an interface of a sealing member in a direction of a two-dimensional spread on a coated surface from deviating from a desired position, where the dummy wires are wires which do not contribute to electrical connection while the principal wires are wires which contribute to electrical connection.

Also, Japanese Patent Application Laid-Open No. H07-335680 proposes, in wire bonding, to form dummy wires whose apex (highest point) is higher than principal wires to protect the principal wires from external forces.

However, although the configuration described in Japanese Patent Application Laid-Open No. H08-336963 is effective against the problem of two-dimensional spreading or narrowing of the sealing member along the coated surface, the configuration is not effective in reducing variations in the height of the sealing member. Thus, this configuration cannot solve the problem of exposed principal wires when the application amount of the sealing member is small.

Also, with the configuration described in Japanese Patent Application Laid-Open No. H07-335680, principal wires are formed to be higher than dummy wires in part of wire bonding regions. Consequently, the problem of exposed principal wires cannot be solved when the application amount of the sealing member is small as described above.

In order to keep the height of the sealing member as low as possible, it is necessary to minimize the amount of sealing member applied to coat the principal wires, but if the application amount decreases due to its variations, the problem of exposed principal wires can arise.

SUMMARY OF THE INVENTION

It is a feature of the present invention to provide a liquid discharge head and manufacturing method therefor which can prevent wires contributory to transmission paths of electrical signals from being exposed from a sealing member.

A liquid discharge head according to the present invention includes: a recording element board provided with an energy generating element adapted to generate energy used to discharge a liquid; an electrical wiring board adapted to supply the energy generating element with an electrical signal for discharging the liquid; a supporting member adapted to support the recording element board and the electrical wiring board; a plurality of wires adapted to connect a plurality of terminals provided on the recording element board with a plurality of terminals provided on the electrical wiring board; a sealing member adapted to seal the plurality of terminals provided on the recording element board and the plurality of terminals provided on the electrical wiring board; wherein the plurality of wires include a plurality of transmitting wires contributory to transmission of electrical signals between the recording element board and the electrical wiring board and a plurality of non-transmitting wires non-contributory to the transmission formed at a higher position than the transmitting wires from that surface of the supporting member which supports the recording element board, and the sealing member is arranged to cover the plurality of transmitting wires as well as to join the plurality of non-transmitting wires.

Also, a manufacturing method for a liquid discharge head according to the present invention includes preparing a recording element board provided with an energy generating element adapted to generate energy used to discharge a liquid and an electrical wiring board adapted to supply the recording element board with an electrical signal for discharging the liquid; connecting a plurality of terminals provided on the recording element board with a plurality of terminals provided on the electrical wiring board using a plurality of wires which include a plurality of transmitting wires contributory to a transmission path of electrical signals between the recording element board and the electrical wiring board and a plurality of non-transmitting wires non-contributory to the transmission path and formed at a higher position than the transmitting wires from that surface of the recording element board on which the energy generating element is formed; and applying a sealing member to a level high enough to entirely cover the plurality of transmitting wires and touch the plurality of non-transmitting wires.

The configuration described above prevents the transmitting wires contributory to the transmission paths of electrical signals from being exposed from the sealing member and thereby prevents breakage and deformation of the transmitting wires.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The embodiments can be applied to a liquid discharge head in general, which discharges a liquid based on an electrical signal from an electrical wiring board. For example, the present invention is applicable to a liquid discharge head mounted on copiers, word processors and other apparatus equipped with a communications system, and even industrial recording apparatus complexly combined with various processing units as well as on typical printing apparatus.

(First Embodiment)

A liquid discharge head according to a first embodiment is similar to a head illustrated in FIG. 1 except for a configuration around electrical connections between a recording element board and electrical wiring board. Therefore, a configuration of the remaining part will be described first briefly with reference to FIG. 1.

The liquid discharge head includes a recording element unit H1001 adapted to discharge liquids by facing a recording medium and a liquid supply member H1500 adapted to lead the liquids to the recording element unit H1001 from outside.

The liquid supply member H1500 is equipped with a common liquid chamber H1501 to supply liquids and joined to the supporting substrate H1200 of the recording element unit H1001 using joining members such as screws H1900. Also, a liquid storage unit H1800 is provided outside the liquid discharge head to hold the liquids supplied to the recording element unit H1001. The liquids in the liquid storage unit H1800 are introduced into the common liquid chamber H1501 of the liquid supply member H1500 via liquid supply tubes H1802.

A configuration of the recording element unit H1001 will be described below. The recording element unit H1001 includes the recording element board H1100, the electrical wiring board H1300, and the supporting substrate H1200 adapted to support the recording element board H1100 and electrical wiring board H1300. Discharge ports (not shown) adapted to discharge liquids are formed on one face (hereinafter referred to as a discharge port side surface) of the recording element board H1100. A plurality of terminals are formed on the discharge port side surface of the recording element board H1100. A plurality of terminals are formed on one face of the electrical wiring board H1300 intended to supply the recording element board H1100 with an electrical signal for discharging the liquids.

The terminals of the electrical wiring board H1300 and terminals of the supporting substrate H1200 are connected with each other via a plurality of wires. Some of the wires are transmitting wires contributory to transmission paths of electrical signals and the remaining wires are non-transmitting wires non-contributory to the transmission paths of electrical signals.

According to a first embodiment, the transmitting wires contributory to the transmission paths of electrical signals and non-transmitting wires non-contributory to the transmission paths of electrical signals are arranged line by line at the same pitch. The transmitting wires contributory to the transmission paths of electrical signals are intended to be protected entirely by the sealing member when these wires are sealed.

Figure 4A:
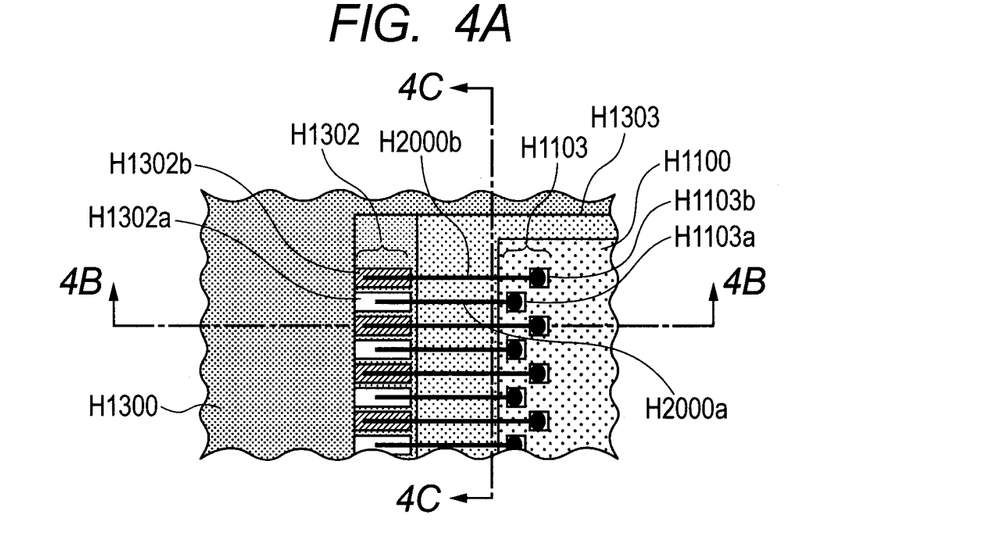
FIG. 4A is a schematic plan view illustrating the neighborhood of a mounting structure of a recording element board according to a first embodiment before sealing.
Figure 4B:
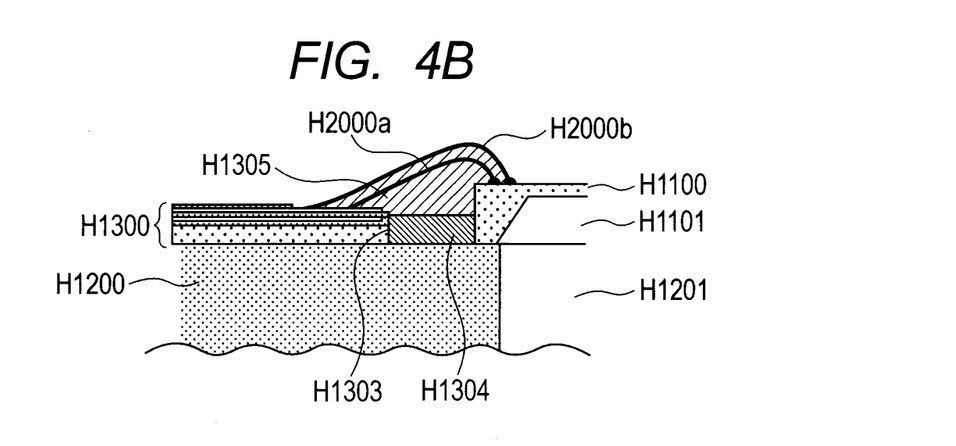
FIG. 4B is an enlarged sectional view taken along line 4B-4B in FIG. 4A, illustrating the neighborhood of the mounting structure of the recording element board according to the first embodiment after sealing.
Figure 4C:
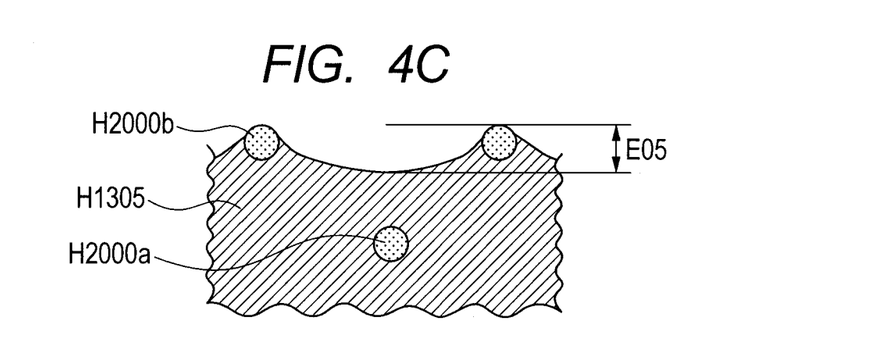
FIG. 4C is an enlarged sectional view taken along line 4C-4C in FIG. 4A, illustrating the neighborhood of the mounting structure of the recording element board according to the first embodiment after sealing.

FIGS. 4A to 4C illustrate the neighborhood of an electrical connection (hereinafter also referred to as a "mounting structure") between the recording element board H1100 and electrical wiring board H1300. FIG. 4A is a schematic plan view illustrating the mounting structure before being sealed. FIG. 4B is a schematic sectional view taken along line 4B-4B in FIG. 4A, illustrating the mounting structure after being sealed. FIG. 4C is an enlarged schematic sectional view taken along line 4C-4C in FIG. 4A, illustrating the mounting structure after being sealed.

The terminal group H1103 made up of multiple conductor patterns is placed on both sides of the recording element board H1100 firmly bonded to the supporting substrate H1200. Some of the terminals in the terminal group H1103 are electrode terminals H1103a contributory to transmission paths of electrical signals and the remaining terminals are dummy board terminals H1103b non-contributory to the transmission paths of electrical signals. A line of the electrode terminals H1103a and a line of the dummy board terminals H1103b are arranged at an interval of 0.075 mm.

The electrical wiring board H1300 has the opening H1303, in which the recording element board H1100 is placed. Also, the terminal group H1302 corresponding to the terminal group H1103 of the recording element board H1100 is placed around opposite ends of the opening H1303 of the electrical wiring board H1300. Some of the terminals in the terminal group H1302 of the electrical wiring board H1300 are wiring electrode terminals H1302a contributory to transmission paths of electrical signals and the remaining terminals are dummy wiring terminals H1302b non-contributory to the transmission paths of electrical signals. According to the present embodiment, the wiring electrode terminals 1302a and the dummy wiring terminals H1302b are placed alternately.

The board terminal group H1103 and wiring terminal group H1302 are connected, for example, via a plurality of wires H2000 with a diameter of 0.25 mm by wire bonding technology. The wires H2000 include a plurality of transmitting wires H2000a adapted to connect the board electrode terminals H1103a with the wiring electrode terminals H1302a and non-transmitting wires H2000b adapted to connect the dummy board terminals H1103b with the dummy wiring terminals H1302b. The transmitting wires H2000a contribute to the transmission paths of electrical signals and non-transmitting wires H2000b do not contribute to the transmission paths of electrical signals. As an example, a distance between two bonding points (connection points) interconnected by the transmitting wire H2000a is 1.440 mm. On the other hand, a distance between bonding points interconnected by the non-transmitting wire H2000b is 1.500 mm. The distance between the bonding points on the board electrode terminal H1103a and dummy board terminal H1103b can be 0.030 mm or more. Also, the wiring electrode terminals H1302a and dummy wiring terminals H1302b are placed outside a region in which the transmitting wires H2000a are laid.

A height difference of about 0.260 mm is provided between that surface of the recording element board H1100 on which the terminal group H1103 is provided and that surface of the electrical wiring board H1300 on which the terminal group H1302 is provided. Non-transmitting wires H2000b form loops with a maximum height of, for example, 0.080 mm from a surface on which the dummy board terminals H1103b are provided. Transmitting wires H2000a form loops with a maximum height of, for example, 0.050 mm from a surface on which the board electrode terminals H1103a are provided. Each non-transmitting wire H2000b can be formed to be higher than the corresponding transmitting wire H2000a in an entire area between the two terminals (H1103a and H1302a) interconnected by the transmitting wire H2000a (see FIG. 4B). As an example, the height difference is set to be the 0.030 mm.

A groove formed between the opening H1303 of the electrical wiring board H1300 and side faces of the recording element board H1100 is filled with the first sealing member H1304 with a viscosity of, for example, 26 [Pa·s]. Also, the wiring electrode terminals H1302a of the electrical wiring board H1300, the board electrode terminals H1103a of the recording element board H1100, and the transmitting wires H2000a are sealed by the second sealing member H1305 with a viscosity of, for example, 26 [Pa·s]. The second sealing member H1305 is configured to entirely cover at least the transmitting wires H2000a and fill a space between the non-transmitting wires H2000b and first sealing member H1304.

Using the head configured as described above, an experiment was conducted to fill the space between the non-transmitting wires H2000b and first sealing member H1304 with the second sealing member H1305, and it was confirmed that an interface of the second sealing member H1305 was held by the non-transmitting wires H2000b. This means that the non-transmitting wires H2000b are formed along the interface between the second sealing member H1305 and an atmosphere. As illustrated in FIG. 4C, depression in the interface of the second sealing member H1305 had a maximum value E05 equal to approximately 0.020 mm when the total application amount of the first and second sealing members H1304 and H1305 was reduced 10% from a predetermined set value. Consequently, even if the application amount of the sealing members H1304 and H1305 is reduced by up to 10%, the transmitting wires H2000a are protected by the sealing member H1305 at least 0.010 mm thick, and thus kept from being exposed. In this way, even if there are variations in the application amounts of the sealing members, the transmitting wires H2000a are kept from being exposed from the second sealing member H1305.

Also, since the non-transmitting wires H2000b can be connected to prevent exposure of the transmitting wires H2000a in a manner similar to when the transmitting wires H2000a are bonded, the height of the sealing member H1305 can be adjusted easily with high accuracy. This enables providing the liquid discharge head in which exposure of the transmitting wires H2000a is prevented and the height of sealing member is minimized.

(Second Embodiment)

Next, the configuration of a liquid discharge head according to a second embodiment will be described. The configuration of the second embodiment is similar to that of the first embodiment except for the neighborhood of the electrical connection between the recording element board and electrical wiring board, and description of the same components as the first embodiment will be omitted.

According to the second embodiment, a pitch of the non-transmitting wires H2000b non-contributory to transmission paths of electrical signals is set larger than a pitch of the transmitting wires H2000a contributory to the transmission paths of electrical signals. The transmitting wires H2000a contributory to the transmission paths of electrical signals are entirely protected by the sealing member H1305.

Figure 5A:
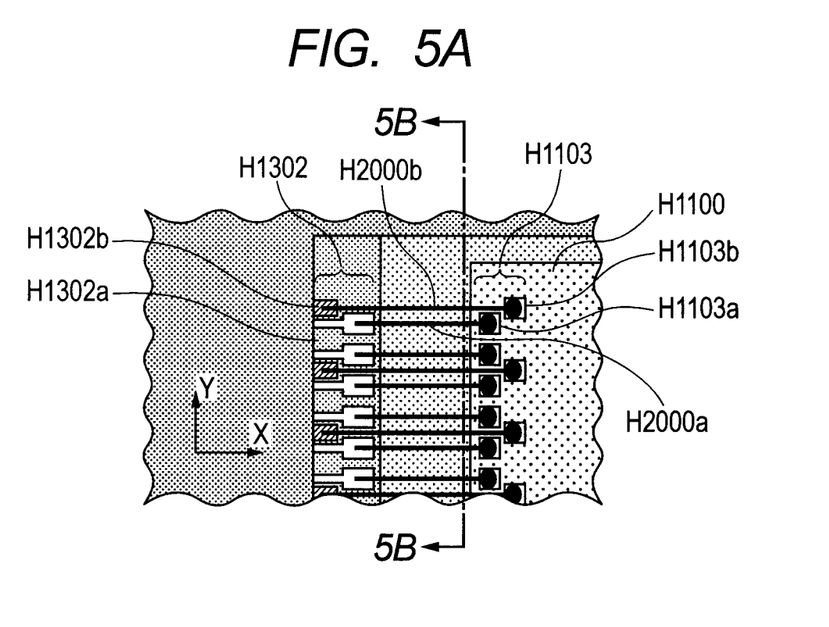
FIG. 5A is a schematic plan view illustrating the neighborhood of a mounting structure of a recording element board according to a second embodiment before sealing.
Figure 5B:
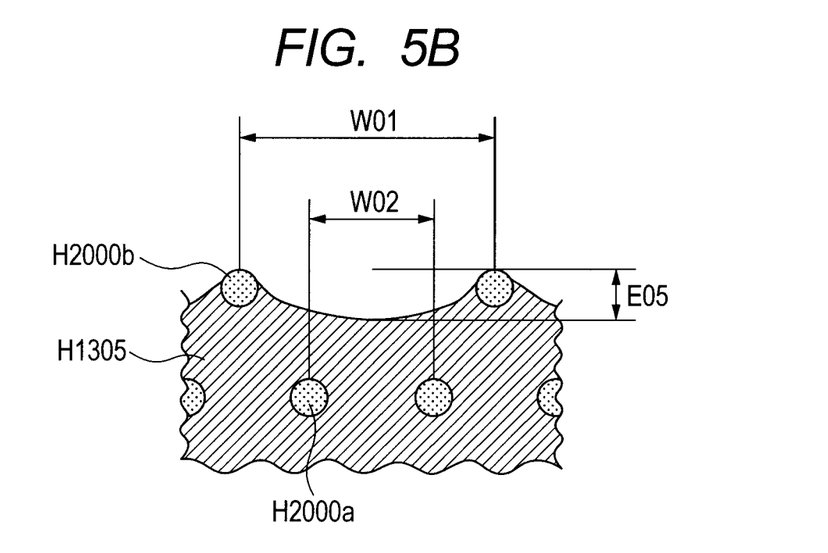
FIG. 5B is an enlarged sectional view taken along line 5B-5B in FIG. 5A, illustrating the neighborhood of the mounting structure of the recording element board according to the second embodiment after sealing.

FIGS. 5A and 5B are schematic diagrams illustrating a mounting structure of the liquid discharge head according to the present embodiment, where 5A is a schematic plan view illustrating the mounting structure before sealing while 5B is an enlarged sectional view taken along line 5B-5B in FIG. 5A, illustrating the mounting structure after sealing. A sectional view taken along a direction parallel to the wires H2000a and H2000b is similar to FIG. 4B, and thus omitted herein.

As in the case of the first embodiment, the terminal group H1103 on the recording element board H1100 and the terminal group H1302 on the electrical wiring board H1300 are interconnected via a plurality of wires. The plurality of wires include the transmitting wires H2000a which connect the board electrode terminals H1103a with wiring electrode terminals H1302a, and the non-transmitting wires H2000b which connect the dummy board terminals H1103b with dummy wiring terminals H1302b. The non-transmitting wires H2000b are formed to be higher than the transmitting wires H2000a in the entire area in which the board electrode terminals H1103a and wiring electrode terminals H1302b are linked.

A pitch W01 between adjacent non-transmitting wires H2000b is set to be larger than a pitch W02 between adjacent transmitting wires H2000a. According to the present embodiment, the pitch W01 is 0.150 mm and the pitch W02 is 0.075 mm. The diameters of the wires, the distance between the bonding points of the transmitting wires H2000a and non-transmitting wires H2000b, the height difference between the surface on which the terminal group H1103 is formed and the surface on which the terminal group H1302 is formed, and the loop height of the wires are the same as the first embodiment. The connection between the electrical wiring board H1300 and recording element board H1100 on which the wires H2000a or H2000b are formed can be sealed under the same conditions as in the first embodiment.

The second sealing member H1305 is formed such that the interface will be held by the non-transmitting wires H2000b in the manner described above. It was confirmed that even if the application amounts of the first sealing member H1304 and second sealing member H1305 showed variations of up to 10% in total, the transmitting wires H2000a were protected by the sealing member H1305 at least 0.010 mm thick. Also, the loop height of the non-transmitting wires H2000b and viscosity of the second sealing member H1305 can be increased and the variations in the application amounts can be reduced. In this case, the non-transmitting wires H2000b can hold the interface of the second sealing member H1305 strongly, allowing the pitch W01 of the non-transmitting wires H2000b to be increased.

Also, the non-transmitting wires H2000b can be formed by the same method as for bonding the transmitting wires H2000a. This allows the height of the sealing member H1305 to be adjusted easily with high accuracy. Thus, the present embodiment provides a liquid discharge head which can prevent exposure of the transmitting wires H2000a and minimize the height of the sealing member H1305.

Also, compared to the first embodiment, by increasing the pitch W01 of the non-transmitting wires H2000b, the present embodiment can reduce the numbers of dummy board terminals H1103b and dummy wiring terminals H1302b and the number of non-transmitting wires H2000b.

(Third Embodiment)

Next, the configuration of a liquid discharge head according to a third embodiment will be described. The configuration of the third embodiment is similar to that of the first embodiment except for the neighborhood of the electrical connection between the recording element board and electrical wiring board, and description of the same components as in the first embodiment will be omitted.

Figure 6:
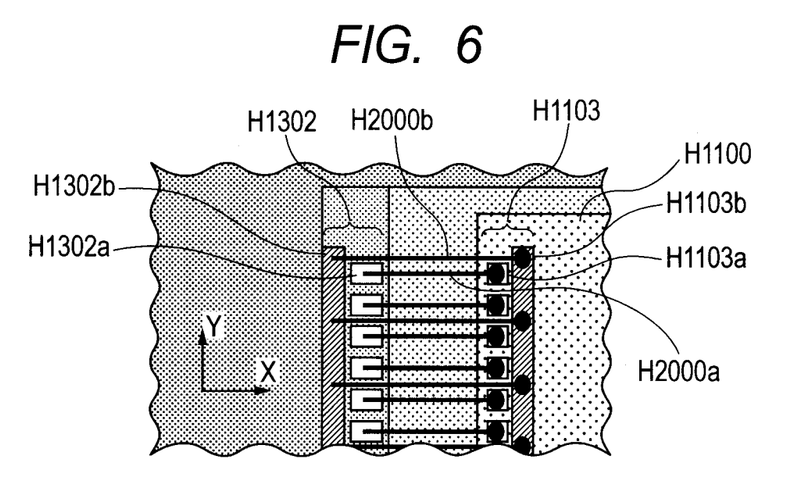
FIG. 6 is a schematic plan view illustrating the neighborhood of a mounting structure of a recording element board according to a third embodiment before sealing.

According to the third embodiment, the mounting structure is sealed, as in the case of the first and second embodiments. The dummy board terminals H1103b and dummy wiring terminals H1302b differ in shape from those in the first and second embodiments. According to the present embodiment, both dummy board terminals H1103b and dummy wiring terminals H1302b non-contributory to the transmission paths of electrical signals are formed continuously. Besides, the pitch between adjacent non-transmitting wires H2000b are allowed to be set freely.

According to the present embodiment, as illustrated in FIG. 6, the dummy board terminals H1103b and dummy wiring terminals H1302b non-contributory to the transmission paths of electrical signals are connected with each other via the non-transmitting wires H2000b. The dummy board terminals H1103b have a continuous shape along a single direction, and so do dummy wiring terminals H1302b. Therefore, the non-transmitting wires H2000b may be arranged at any pitch. The pitch can be set to such a level, according to the viscosity of the second sealing member H1305, that will allow the interface of the second sealing member. H1305 to be held sufficiently by surface tension. This makes it easy to protect the transmitting wires H2000a entirely by the second sealing member H1305, as in the case of the first and second embodiments.

The present embodiment is the same as the second embodiment except for forms of the dummy board terminals H1103b and dummy wiring terminals H1302b, including, for example, wire diameters, the bonding point distance and relative positions between the transmitting wires and non-transmitting wires, the wire pitches W01 and W02, the height difference between the formation surfaces of the terminal groups H1103 and H1302, and the loop height of wires. Also, the wires H2000a and H2000b and the first and second sealing members H1304 and H1305 may be the same as those in the first and second embodiments. Consequently, even if the application amounts of the first sealing member H1304 and second sealing member H1305 show variations of up to 10% in total, the transmitting wires H2000a are protected by the sealing member H1305 at least 0.010 mm thick.

According to the present embodiment, the pitch of the non-transmitting wires H2000b adapted to hold the interface of the second sealing member H1305 can be set freely.

Therefore, for example, if the application amount becomes larger at the start or end of application, the height of the second sealing member H1305 can be optimized by increasing only the pitch W01 of the non-transmitting wires H2000b at the location where the application amount becomes larger. Also, if the application amount becomes smaller in some part, causing the transmitting wires H2000a to get exposed easily, the non-transmitting wires H2000b can be formed only in that part or the pitch W01 of the non-transmitting wires H2000b can be reduced only in that part. In this way, the present embodiment can deal with a situation in which the application amount of the sealing member varies depending on the region to be coated.

According to the first and second embodiments, two adjacent wires out of the plurality of non-transmitting wires H2000b are placed on both sides of at least one transmitting wire H2000a, extending in a direction along the transmitting wire. In this way, two adjacent non-transmitting wires H2000b holds the interface of the second sealing member H1305, preventing exposure of the transmitting wire H2000a between the adjacent non-transmitting wires H2000b.

If the dummy wiring terminals H1302b are formed as a continuous straight line, and so are the dummy board terminals H1103b, as with the third embodiment, the transmitting wires H2000a and non-transmitting wires H2000b can be arranged by being superimposed one over the other. That is, even if the transmitting wires H2000a have high wiring density and the non-transmitting wires H2000b are formed above the transmitting wires H2000a, interference between the wires can be avoided. In so doing, the non-transmitting wires H2000b can be placed right above the respective transmitting wires H2000a, extending along the transmitting wires. This prevents the transmitting wires H2000a more reliably from being exposed from the sealing member H1305.

(Fourth Embodiment)

Next, the configuration of a liquid discharge head according to a fourth embodiment will be described. The configuration of the fourth embodiment is similar to that of the first embodiment except for the neighborhood of the electrical connection between the recording element board and electrical wiring board, and description of the same components as in the first embodiment will be omitted.

The fourth embodiment is intended to improve holding power of the non-transmitting wires H2000b, i.e., the power to hold the interface of the sealing member H1305, by changing the diameter and shape of the non-transmitting wires H2000b.

Figure 7:
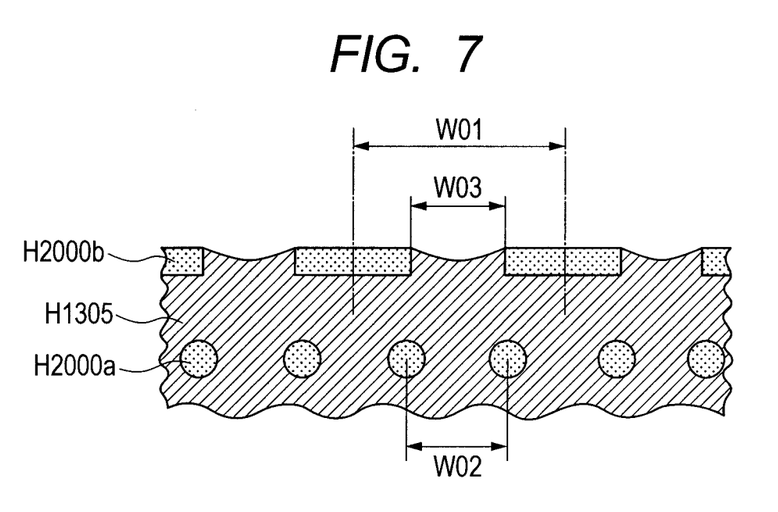
FIG. 7 is an enlarged sectional view illustrating the neighborhood of a mounting structure of a recording element board according to a fourth embodiment.

According to the present embodiment, ribbon wires with a rectangular sectional shape are used as the non-transmitting wires H2000b interconnecting the dummy board terminals H1103b and dummy wiring terminals H1302b non-contributory to the transmission paths of electrical signals. Specifically, the non-transmitting wires H2000b have a wide rectangular sectional shape in a direction parallel to board surfaces of the recording element board H1100 and electrical wiring board H1300. This increases the holding power to hold the interface of the sealing member H1305.

FIG. 7 illustrates an enlarged sectional view of the liquid discharge head according to the present embodiment after sealing. The cross section illustrated in FIG. 7 is taken along a line corresponding to line 4C-4C in FIG. 4A. The present embodiment is the same as the second embodiment except for the pitch W02 between adjacent transmitting wires H2000a, pitch between adjacent non-transmitting wires H2000b, and shape of the non-transmitting wires H2000b.

As an example, the pitch W02 between the transmitting wires H2000a was set to 0.150 mm. Ribbon wires 0.025 mm in thickness and 0.150 mm in width were used as the non-transmitting wires H2000b. The pitch W01 between adjacent non-transmitting wires H2000b was 0.300 mm. As a result, a sealing interface distance W03 between the adjacent non-transmitting wires H2000b was 0.150 mm.

Thus, the present embodiment allows the sealing interface distance W03 to be reduced while keeping a wide pitch between adjacent non-transmitting wires H2000b. This enables reducing the numbers of dummy board terminals H1103b and dummy wiring terminals H1302b non-contributory to the transmission paths of electrical signals as well as the number of non-transmitting wires H2000b. Furthermore, this increases resistance to deformation and collapse of the wires H2000a and H2000b which would occur during application of the sealing member H1305, and consequently further stabilizes the height and shape of the interface of the sealing member H1305.

Although in the present embodiment, ribbon wires with a rectangular sectional shape are used as the non-transmitting wires H2000b, the present invention is not necessarily limited to this shape. As long as sectional width of the non-transmitting wires in a direction parallel to the board surfaces of the recording element board H1100 and electrical wiring board H1300 is larger than sectional width of the transmitting wires, the effect of holding the interface of the sealing member H1305 can be increased.

(Fifth Embodiment)

Next, as a fifth embodiment, a manufacturing method for the liquid discharge head according to one of the above embodiments will be described. The manufacturing method for a liquid discharge head according to the fifth embodiment includes a preparation step, a bonding step and a sealing step.

The preparation step involves preparing a recording element board provided with an energy generating element adapted to generate energy used to discharge a liquid and an electrical wiring board adapted to supply the recording element board with an electrical signal for discharging the liquid.

Next, in the bonding step, a recording element board and electrical wiring board are interconnected via a plurality of wires. Specifically, the recording element board and electrical wiring board are interconnected via a plurality of transmitting wires contributory to transmission paths of electrical signals therebetween and a plurality of non-transmitting wires non-contributory to the transmission paths. The non-transmitting wires are formed to be higher from the electrical wiring board than the transmitting wires in the entire area in which the transmitting wires exist.

Next, in the sealing step, a sealing member is formed so as to entirely cover a plurality of transmitting wires. Even if there are variations in the application amount of the sealing member, resulting in reductions in the application amount, the interface of the sealing member is held by the plurality of non-transmitting wires and surface tension of the sealing member. This prevents the transmitting wires from being exposed from the sealing member.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-125115, filed May 31, 2010, which is hereby incorporated by reference herein in its entirety.

What is claimed is:

1. A liquid discharge head comprising:
   a recording element board provided with an energy generating element adapted to generate energy used to discharge a liquid;
   an electrical wiring board adapted to supply the energy generating element with an electrical signal for discharging the liquid;
   a supporting member adapted to support the recording element board and the electrical wiring board;
   a plurality of wires adapted to connect a plurality of terminals provided on the recording element board and a plurality of terminals provided on the electrical wiring board with each other; and
   a sealing member adapted to seal the plurality of terminals provided on the recording element board and the plurality of terminals provided on the electrical wiring board,
   wherein the plurality of wires include a plurality of transmitting wires contributory to transmission of electrical signals between the recording element board and the electrical wiring board and a plurality of non-transmitting wires non-contributory to the transmission of electrical signals, the non-transmitting wires being formed at a higher position than that of the transmitting wires from a surface of the supporting member which supports the recording element board, and
   wherein all parts of each of the plurality of transmitting wires are covered by the sealing member, whereas some parts of each of the plurality of non-transmitting wires are covered by the sealing member and other parts are exposed through the sealing member.

2. The liquid discharge head according to claim 1, wherein each pair of adjacent non-transmitting wires out of the plurality of non-transmitting wires is placed on both sides of at least one of the transmitting wires when viewed from a direction perpendicular to the recording element board.

3. The liquid discharge head according to claim 1, wherein the non-transmitting wires are placed right above the transmitting wires.

4. The liquid discharge head according to claim 1, wherein in a direction parallel to the surface of the supporting member which supports the recording element board, the sectional width of the non-transmitting wires is larger than that of the transmitting wires.

5. The liquid discharge head according to claim 1, wherein a section of the non-transmitting wires in a direction perpendicular to the recording element board is rectangular in shape.

6. A manufacturing method for a liquid discharge head, comprising:
   preparing a recording element board provided with an energy generating element adapted to generate energy used to discharge a liquid and an electrical wiring board adapted to supply the recording element board with an electrical signal for discharging the liquid;
   connecting a plurality of terminals provided on the recording element board and a plurality of terminals provided on the electrical wiring board with each other using a plurality of wires which include a plurality of transmitting wires contributory to a transmission path of electrical signals between the recording element board and the electrical wiring board and a plurality of non-transmitting wires non-contributory to the transmission path and formed at a higher position than the transmitting wires from a surface of the recording element board on which the energy generating element is formed; and
   applying a sealing member to a level high enough to cover all parts of each of the plurality of transmitting wires and only some parts of each of the plurality of non-transmitting wires.

7. A liquid discharge head comprising:
   a recording element board provided with an energy generating element adapted to generate energy used to discharge a liquid;
   an electrical wiring board adapted to supply the energy generating element with an electrical signal for discharging the liquid;
   a supporting member adapted to support the recording element board and the electrical wiring board;

a plurality of wires adapted to connect a plurality of terminals provided on the recording element board and a plurality of terminals provided on the electrical wiring board with each other; and a sealing member adapted to seal the plurality of terminals provided on the recording element board and the plurality of terminals provided on the electrical wiring board, wherein the plurality of wires include a plurality of transmitting wires contributory to transmission of electrical signals between the recording element board and the electrical wiring board and a plurality of non-transmitting wires non-contributory to the transmission of electrical signals, the non-transmitting wires being formed at a higher position than that of the transmitting wires from a surface of the supporting member which supports the recording element board, and the plurality of non-transmitting wires being formed along an interface between the sealing member and an atmosphere.

* * * * *